(12) United States Patent
Zhang et al.

(10) Patent No.: US 10,699,908 B2
(45) Date of Patent: Jun. 30, 2020

(54) METHODS FOR PROCESSING SEMICONDUCTOR WAFERS HAVING A POLYCRYSTALLINE FINISH

(71) Applicant: SunEdison Semiconductor Limited, Singapore (SG)

(72) Inventors: Guoqiang David Zhang, Ballwin, MO (US); Mark Crooks, Inmann, SC (US); Tracy Michelle Ragan, Warrenton, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 150 days.

(21) Appl. No.: 15/577,515

(22) PCT Filed: May 26, 2016

(86) PCT No.: PCT/US2016/034428
§ 371 (c)(1),
(2) Date: Nov. 28, 2017

(87) PCT Pub. No.: WO2016/196216
PCT Pub. Date: Dec. 8, 2016

(65) Prior Publication Data
US 2018/0151384 A1      May 31, 2018

Related U.S. Application Data

(60) Provisional application No. 62/168,247, filed on May 29, 2015.

(51) Int. Cl.
*H01L 21/66*      (2006.01)
*H01L 21/321*     (2006.01)
(Continued)

(52) U.S. Cl.
CPC ...... *H01L 21/30625* (2013.01); *B24B 53/017* (2013.01); *H01L 21/02532* (2013.01);
(Continued)

(58) Field of Classification Search
None
See application file for complete search history.

(56) References Cited

U.S. PATENT DOCUMENTS

| 6,559,040 B1 | 5/2003 | Yu et al. |
| 2006/0046371 A1 | 3/2006 | Moon |

(Continued)

FOREIGN PATENT DOCUMENTS

| EP | 0888846 A2 | 7/1999 |
| EP | 1017090 A1 | 7/2000 |

(Continued)

OTHER PUBLICATIONS

International Search Report and Written Opinion of the International Searching Authority regarding PCT/US2016/034428 dated Aug. 19, 2016; pp. 1-12.

(Continued)

*Primary Examiner* — Stephanie P Duclair
(74) *Attorney, Agent, or Firm* — Armstrong Teasdale LLP

(57) ABSTRACT

A method of processing a semiconductor wafer includes depositing a silicon layer on the semiconductor wafer. The silicon layer has a substantially uniform thickness. The silicon layer is polished to smooth the silicon layer such that the thickness is substantially uniform after polishing.

16 Claims, 8 Drawing Sheets

(51) Int. Cl.
*H01L 21/306* (2006.01)
*H01L 21/304* (2006.01)
*H01L 21/02* (2006.01)
*B24B 53/017* (2012.01)

(52) U.S. Cl.
CPC ...... *H01L 21/02595* (2013.01); *H01L 21/304* (2013.01); *H01L 21/3212* (2013.01); *H01L 22/20* (2013.01); *H01L 22/12* (2013.01)

(56) References Cited

U.S. PATENT DOCUMENTS

2012/0315829 A1    12/2012  Tanikawa et al.
2014/0287653 A1    9/2014   Shimano et al.

FOREIGN PATENT DOCUMENTS

| | | |
|---|---|---|
| JP | H10-098016 A | 4/1998 |
| JP | 2002200552 A | 7/2002 |
| JP | 2004014780 A | 1/2004 |
| JP | 2004022839 A | 1/2004 |
| JP | 2008284645 A | 11/2008 |
| JP | 2009515335 A | 4/2009 |
| JP | 2010115779 A | 5/2010 |
| JP | 2012235045 A | 11/2012 |
| JP | 2014161944 A | 9/2014 |
| WO | 2004013656 A2 | 2/2004 |
| WO | 2007052862 A1 | 5/2007 |

OTHER PUBLICATIONS

European Search Report in European Application No. 19185015.5, dated Nov. 4, 2019. 11 pgs.

METHODS FOR PROCESSING SEMICONDUCTOR WAFERS HAVING A POLYCRYSTALLINE FINISH

CROSS-REFERENCE TO RELATED APPLICATION

This application is a National Stage application of International Application No. PCT/US2016/034428, filed on May 26, 2016, which claims priority to U.S. Provisional Application No. 62/168,247, filed on May 29, 2015, the disclosures of which are hereby incorporated by reference in their entirety.

FIELD

This disclosure relates generally to processing semiconductor wafers and more particularly to systems and methods for processing semiconductor wafers including polishing surfaces of semiconductor wafers.

BACKGROUND

Semiconductor wafers are used in the production of semiconductor devices such as integrated circuit (IC) chips, silicon-on-insulator (SOI) wafers, and radio frequency-SOI (RF-SOI) wafers. Typically, the semiconductor wafers include a high resistivity substrate that can cause formation of a high conductivity inversion accumulation layer, which hinders the performance of the semiconductor devices.

In some processes, a layer, such as a polycrystalline silicon layer, is deposited onto a surface of the semiconductor wafer to provide a density charge trap and, thereby, inhibit the formation of the high conductivity inversion accumulation layer. For example, the layer can be deposited onto a surface that forms the interface between the high resistivity substrate and a buried oxide (BOX) to hinder the movement of charges across the interface. Once deposited, the layer tends to form a rough surface on the semiconductor wafer. Therefore, the rough surface of the semiconductor wafer needs to be further processed to have characteristics that meet the strict parameters for production of semiconductor devices, such as IC chips, SOI wafers, and RF-SOI wafers.

Typically, surfaces of semiconductor wafers are polished to improve surface characteristics including polycrystalline layer roughness and micro-defects. One way to polish a semiconductor wafer is referred to as chemical-mechanical polishing (CMP). CMP processes often use a circular polishing pad mounted on a turntable for driven rotation about a vertical axis and a mechanism for holding the wafer and forcing it to contact the polishing pad. The pad is rotated and the wafer is brought into contact with and forced against the pad by the polishing head. However, the polishing pad degrades over time and the polishing surface of the pad becomes uneven. Such pad wear impacts surface characteristics after polishing, which might cause the wafer to be unsatisfactory or require additional processing.

CMP processes may also significantly change the shape of the semiconductor wafer because portions of the semiconductor wafer are removed in unequal amounts and the thickness of the wafer then has variations. Accordingly, portions of the wafer may have areas of material that are thicker or thinner than necessary or optimal. These variations can cause waste and inefficiencies.

Accordingly, there is a need for a method to polish semiconductor wafers using improved pad wear processes and without substantially changing the shape of the semiconductor wafers. The methods should increase the quality of the wafer for use in high quality semiconductor devices such as IC chips, SOI wafers, and RF-SOI wafers.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a method of processing a semiconductor wafer includes depositing a silicon layer on the semiconductor wafer. The silicon layer has a substantially uniform thickness. The silicon layer is polished to smooth the silicon layer such that the thickness is substantially uniform after polishing.

In another aspect, a method of processing a semiconductor wafer includes depositing a silicon layer on the semiconductor wafer. The silicon layer includes an inner surface facing the semiconductor wafer and an outer surface opposite the inner surface. The silicon layer has a first thickness defined between the inner surface and the outer surface. The first thickness is substantially uniform throughout the silicon layer. The semiconductor wafer is positioned in a polishing apparatus. The polishing apparatus includes a polishing pad having a pad surface. The pad surface defines a center area and an edge area. At least one of the center area and the edge area of the pad surface are dressed based on a wafer profile of the semiconductor wafer. The outer surface of the silicon layer is contacted with the pad surface. Slurry is applied to the outer surface of the silicon layer. The method further includes rotating the pad while the pad surface is in contact with the outer surface of the silicon layer such that a portion of the silicon layer is removed to provide a smooth surface of the silicon layer. A second thickness is defined between the inner surface and the smooth surface. The second thickness is substantially uniform throughout the silicon layer.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

Figure 1:
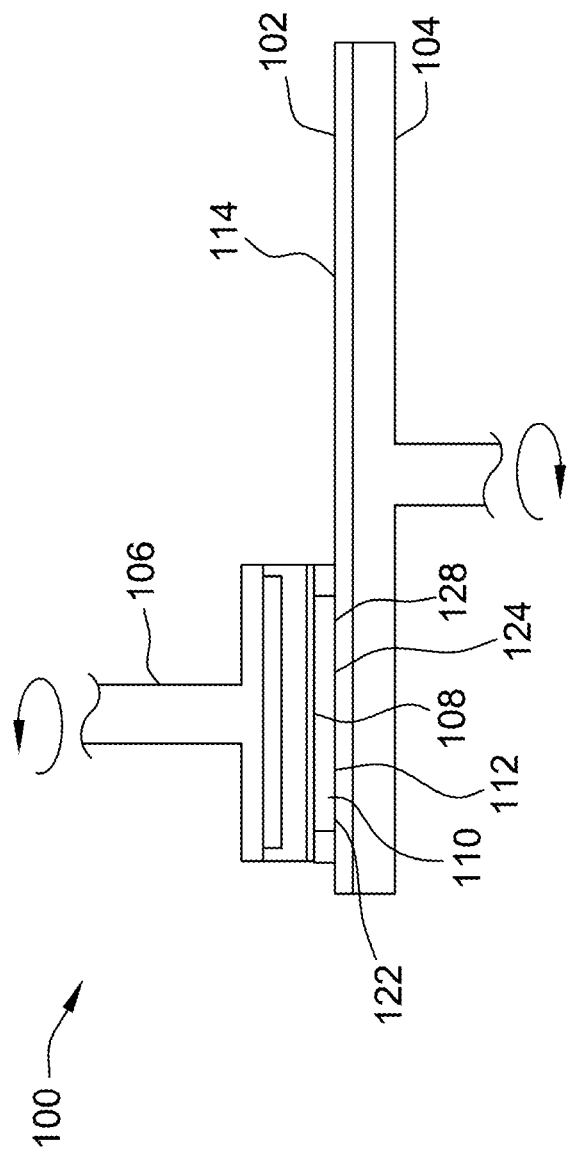
FIG. 1 is a side elevation of one embodiment of a wafer polishing system.

Referring now to the figures and in particular to FIG. 1, one embodiment of a wafer polishing system is generally designated in its entirety by the reference number 100. Wafer polishing system 100 includes a polishing pad 102 mounted on a pivotable base 104 and a wafer mounting device 106 having a rotatable head 108 for mounting a semiconductor wafer 110 on polishing pad 102. Wafer mounting device 106 holds wafer 110 and brings wafer 110 into contact with polishing pad 102 as both wafer 110 and polishing pad 102 are rotated. Polishing pad 102 polishes a surface 112 of wafer 110 through abrasion and with chemicals which may be applied to the surface of polishing pad 102.

A polishing surface 114 of polishing pad 102 is used to polish multiple wafers over many polishing processes, and may become worn during continued use, which can negatively affect the polished surface of wafer 110. A pad dressing system 120, shown in FIGS. 2 and 3, of wafer polishing system 100 is constructed for dressing (i.e., abrading and compressing) polishing surface 114 of polishing pad 102 to facilitate polishing wafer 110 to have a smooth polished surface and a desired post-polishing shape.

In the example embodiment, dressing system 120 includes a dressing member 118. Dressing member 118 contacts polishing pad 102 as polishing pad 102 rotates to dress portions of polishing surface 114. Dressing member 118 may be diamond impregnated. Suitable dressing members are manufactured by Kinik Company of Taiwan. In one embodiment, a dressing surface 117 of dressing member 118 may have a diameter between about 30 mm and about 10 mm, for example, about 20 mm. A small dressing surface provides for more precise dressing of polishing pad 102 to facilitate polishing pad 102 producing smoother and/or more uniform polished wafers having a desired post-polishing shape.

As can be seen in FIG. 1, polishing surface 114 has a larger diameter than wafer 110. Accordingly, only a functional portion of polishing surface 114 polishes wafer 110. In the example embodiment, the diameter of polishing surface 114 (e.g., about 546.1 mm (21.5 in)) is more than twice the diameter of wafer 110 (e.g., about 200 mm (7.87 in)). As a result, dressing system 120 does not need to dress the entire polishing surface 114 and can be configured to dress only the functional portions of polishing surface 114.

Figure 2:
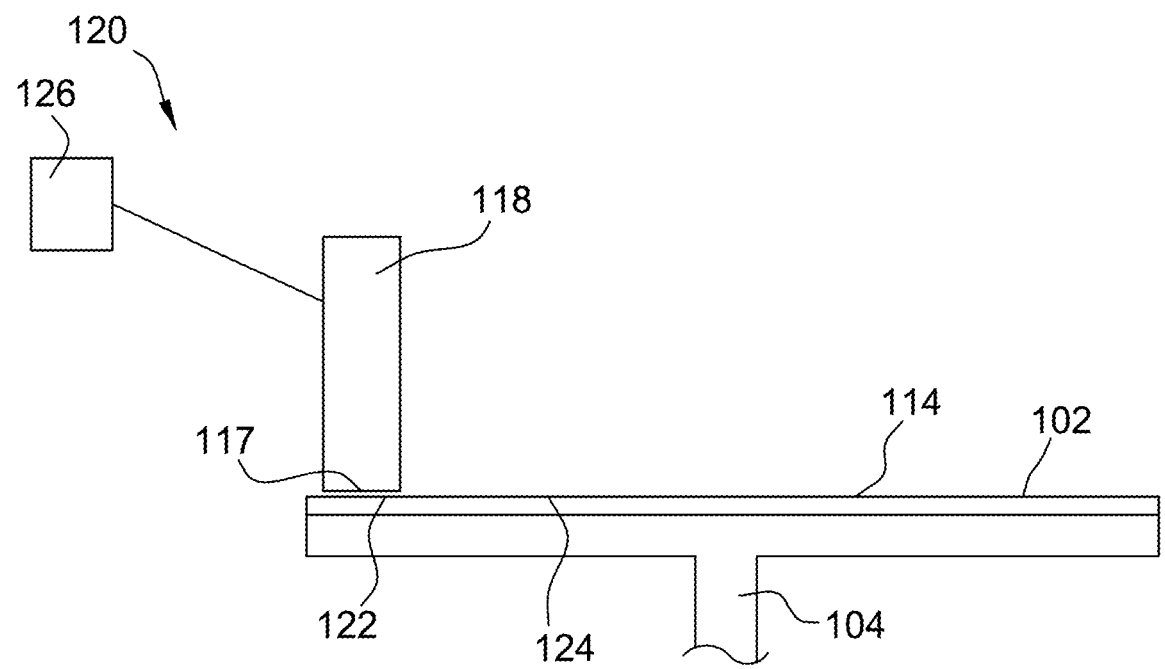
FIG. 2 is a side elevation of one embodiment of a dressing system positioned for dressing the edge of a polishing pad.
Figure 3:
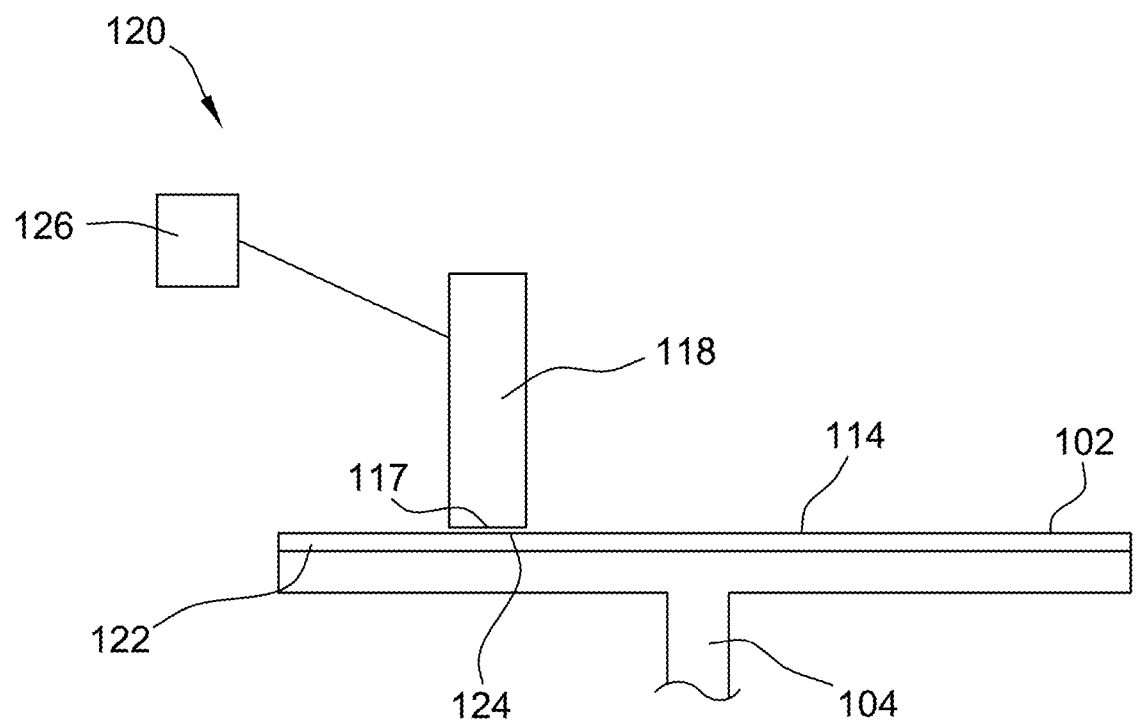
FIG. 3 is a side elevation of the dressing system shown in FIG. 2, positioned for dressing the center of the polishing pad.

Accordingly, dressing system 120 is configured for selectively dressing polishing surface 114 by positioning dressing member 118. FIGS. 2 and 3 show dressing system 120 with dressing member 118 positioned for dressing different portions of polishing surface 114. In FIG. 2, dressing member 118 is positioned for dressing an edge area 122 of polishing pad 102. In FIG. 3, dressing member 118 is positioned for dressing a center area 124 of polishing pad 102.

A controller 126, such as a microcontroller, controls dressing system 120 to dress polishing pad 102, e.g., controller 126 adjusts the amount of force applied to individual radial zones of polishing pad 102 by dressing member 118 according to the instructions given in a pre-programmed recipe. Controller 126 may also control motion of polishing pad 102 (e.g., the rotatable base of the polishing pad), and the wafer mounting device 113 (e.g., the rotatable head of the mounting device).

Figure 4:
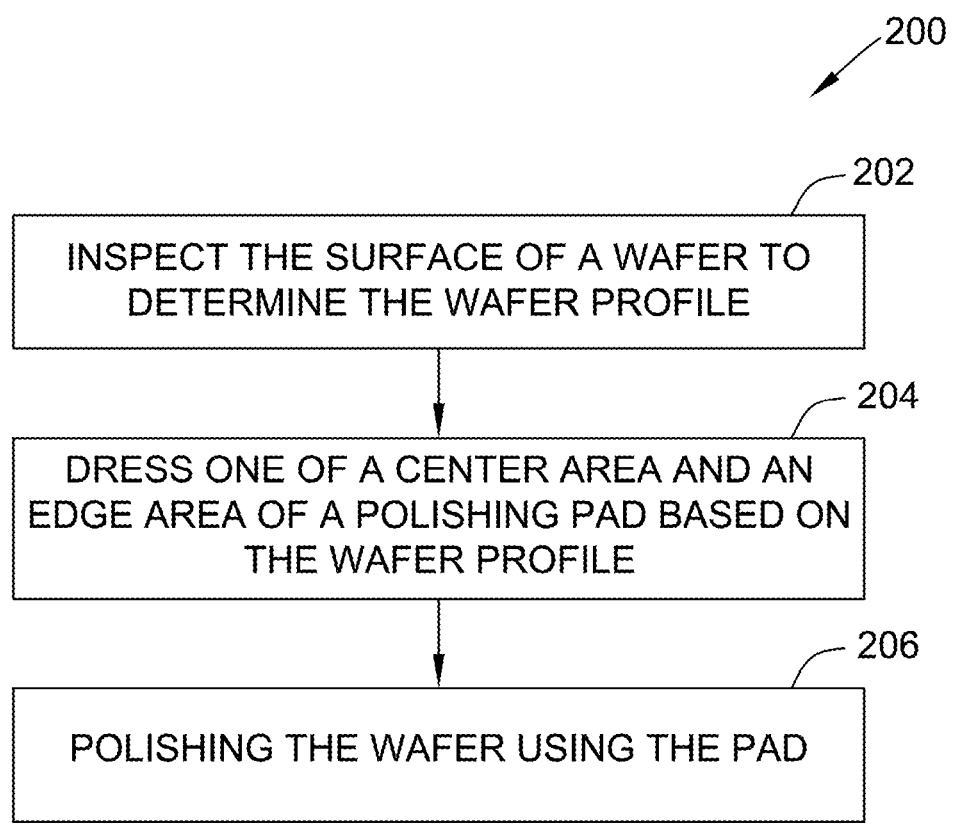
FIG. 4 is a flow diagram showing one embodiment of a method of processing a semiconductor wafer.

FIG. 4 is a flow chart of an example method 200 of processing semiconductor wafers. Method 200 generally includes inspecting 202 surface 112 of wafer 110 to determine the wafer thickness profile, based on the inspection, determine whether to dress 204 one of edge area 122 and center area 124 of polishing pad 102 based on the wafer profile, and polishing 206 wafer 110.

In some embodiments, inspecting 202 may be performed, at least in part, by an operator or may be fully automated. As discussed in more detail below, the wafer profile may be flat (FIG. 7A), dished (FIG. 7B), domed (FIG. 7C), or any other suitable shape. The inspected wafer can be an unpolished wafer used to determine an initial shape that will provide a basis for an intended finish shape of the wafer. Alternatively, the inspected wafer can be a polished wafer that is inspected to determine deviations from the intended finish shape. The deviations may indicate a wearing of the pad and/or buildup on the pad, which require corrective conditioning.

In some embodiments, inspecting 202 includes inspecting wafer 110 to determine an initial wafer profile. Broadly, the operator, or controller 126, could classify the wafer shape profile and dress polishing pad 102 accordingly. For example, if the initial wafer profile is determined to be dish-shaped (FIG. 7B), polishing pad 102 can be dressed in edge area 122 such that less of edge area 122 is removed. As a result, the post-polishing wafer profile will be substantially dish-shaped and, thus, match the initial wafer profile. Alternatively, if the initial wafer profile is determined to be dome-shaped (FIG. 7C), polishing pad 102 can be dressed in the center area 124 such that less of center area 124 is removed. As a result, the post-polishing wafer profile will be substantially dome-shaped and, thus, match the initial wafer profile.

In some embodiments, a polished wafer will be inspected to determine the post-polishing wafer profile. The post-polishing wafer profile is compared to the initial wafer profile to determine variations between the profiles. Alternately, the post-polishing wafer profile can be compared against a stored target wafer profile. Based on the variations between the post-polishing wafer profile and the initial wafer profile or target wafer profile, one of center area 124 and edge area 122 of pad surface 114 can be dressed. If the variations between the post-polishing wafer profile and the initial wafer profile of the target wafer profile indicate wafer 110 is worn too much in center area 124, then polishing pad 102 should be dressed in center area 124. If the variations indicate wafer 110 is worn too much in edge area 122, then polishing pad 102 should be dressed in edge area 122.

Some embodiments of method 200 further include using a wafer measuring device (not shown), such as an ADE UltraGage 9700, which measures the thickness of a sampled wafer, to assist in determining the wafer profile either before or after polishing. The thickness of the wafer is extrapolated through 360 degrees to obtain an average radial two-dimensional profile of the sampled wafer. The sampling rate for obtaining the average radial profile of a previously polished wafer may be about 1 wafer from every 25 wafers polished. It is understood that a greater number of wafers may be polished between samplings, or alternatively, fewer wafers may be polished between samplings. Moreover, the sampling rate may change during the life of the polishing pad.

In method 200, wafer 110, not polishing surface 114 of the polishing pad 102, is analyzed to determine an appropriate dressing process for polishing pad 102. In general, it is believed that deriving a dressing process based on the sampled wafer is easier and more efficient than deriving a dressing process based on polishing surface 114 of the polishing pad 102. The radial profile of a wafer can be readily and accurately measured and the radial profile may be analyzed to determine which areas of the polishing pad need to be dressed and to what extent the specific areas need to be dressed. The frequency of the dressing of polishing pad can be determined based on factors such as the observed wear on the polishing pad and/or the severity of change of wafer shape. It is contemplated that any parts of the method or the entire procedure may be automated, so the controller 126 measures a polished wafer, analyzes the radial profile of the sampled polished wafer and/or chooses the appropriate dressing recipe based on the radial profile of the sampled polished wafer.

After inspection, in some embodiments, a desired area of the polishing pad is selected to be dressed, e.g., either center area 124 or edge area 122 of polishing pad 102. According to the selection, dressing member 118 is positioned appropriately to dress edge area (FIG. 2), center area (FIG. 3), and/or other suitable areas of polishing pad 102.

Figure 5:
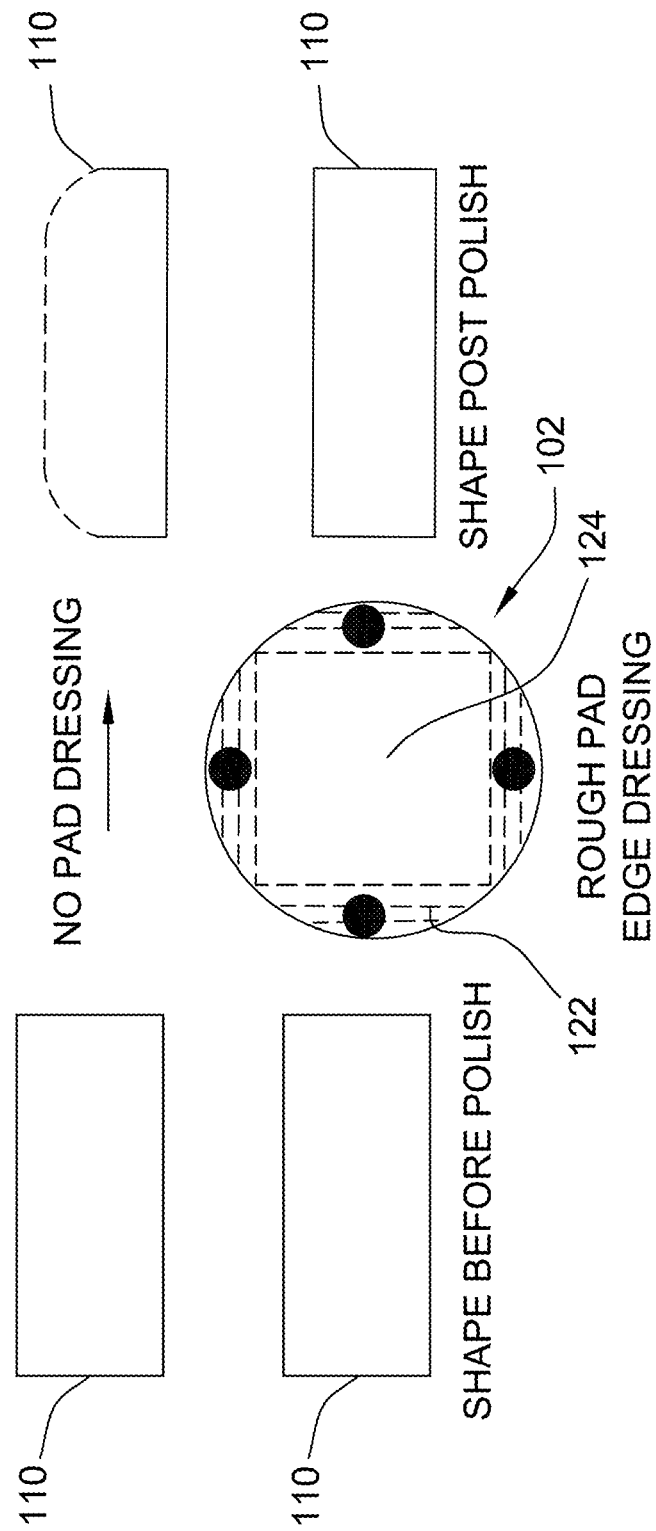
FIG. 5 is an illustration showing changes in wafer shape due to dressing the edges of a polishing pad.
Figure 6:
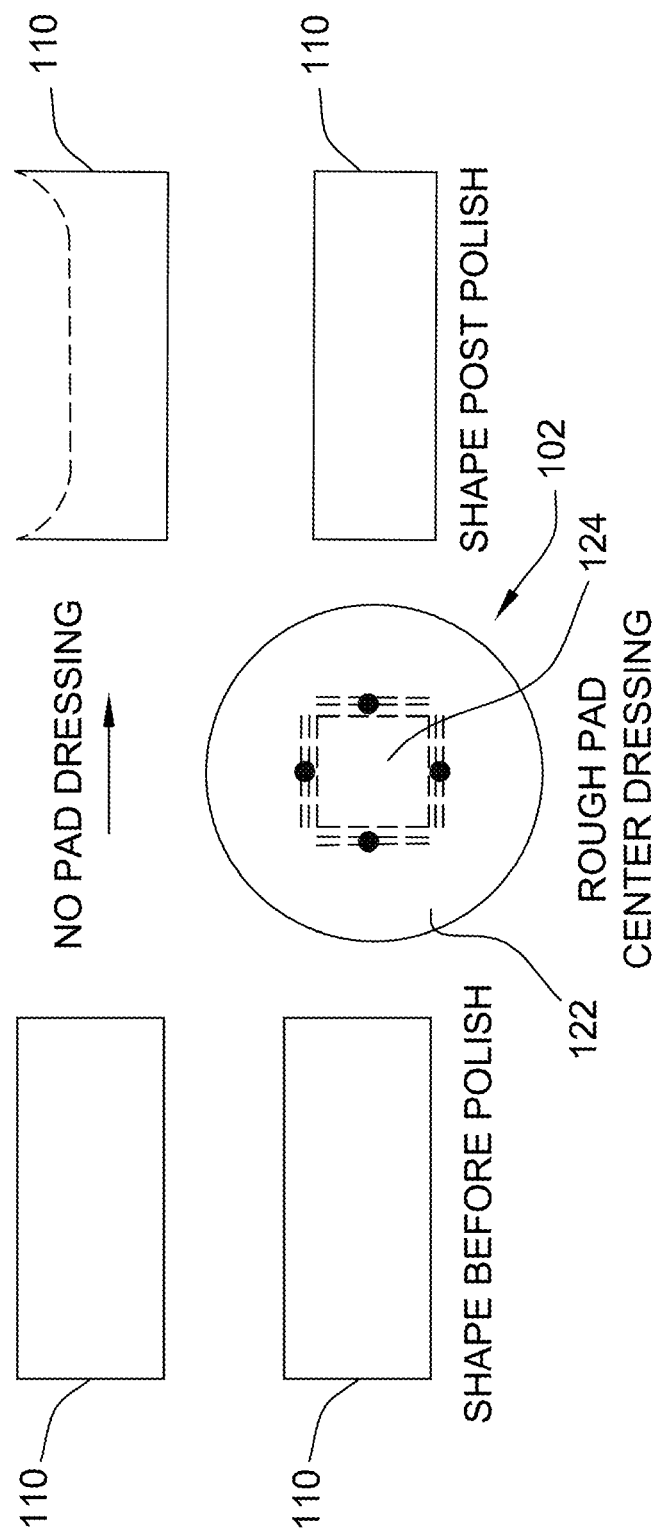
FIG. 6 is an illustration showing changes in wafer shape due to dressing the center of a polishing pad.

FIG. 5 and FIG. 6 are illustrations showing the change in wafer shape due to dressing either edge area 122 or center area 124 of polishing pad 102. As shown in FIG. 5, edge area 122 of polishing pad 102 can be dressed when an operator, or controller 126 for an automated process, determines less edge area removal is desired, e.g., the inspected wafer indicates the polishing pad is removing too much of the edge area of the wafer. Edge area 122 of the polishing pad corresponds to where an edge of wafer 110 reaches when wafer 110 is oscillated during polishing. Accordingly, the size of edge area 122 will depend on the size of wafers 110 to be polished and the overall size of polishing pad 102. In the example embodiment, edge area 122 extends radially between about 2.5 cm (1 inch) and about 5 cm (2 inches) from the outer edge of polishing pad 102.

As shown in FIG. 6, center area 124 of polishing pad 102 can be dressed when an operator, or controller 126 for an automated process, determines less center area removal is desired, e.g., the inspected wafer indicates the polishing pad is removing too much of the center area of the wafer. Center area 124 of polishing pad 102 contacts the middle portion of wafer 110 when wafer 110 is oscillated during polishing. Accordingly, the size of center area 124 will depend on the size of wafer 110 and the overall size of polishing pad 102. In the example embodiment, center area 124 is spaced radially inward from the outer edge of polishing pad 102 between about 15 cm (6 inches) and about 20 cm (8 inches).

Dressing the different areas of the polishing surface 114 based on the wafer profiles is an accurate way of producing polished wafers with substantially uniform thicknesses. Accordingly, the described polishing method provides for a "shape match polishing," where wafer 110 is polished such that a post-polished wafer profile substantially matches an initial wafer profile. In one embodiment, shape match polishing generally includes polishing a silicon layer 128 deposited on wafer 110 to smooth wafer 110 such that silicon layer 128 is removed substantially uniformly across wafer 110, i.e., the thickness of silicon layer 128 is removed substantially uniformly throughout wafer 110. Since silicon layer 128 is deposited on wafer 110 with a substantially uniform thickness, silicon layer 128 will still have a substantially uniform thickness after shape match polishing.

Accordingly, wafer 110 will have the same shape after polishing as it did before polishing. In addition, wafer 110 will have a reduced thickness and enhanced surface characteristics, such as smoothness, after polishing. Moreover, by maintaining a uniform thickness of silicon layers 128, shape match polishing reduces waste during semiconductor wafer processing. For example, in some embodiments, less material will be removed during shape match polishing than during typical semiconductor wafer processing. In example embodiments, between about 0.2 micrometers and about 2 micrometers of the thickness of the material is removed during shape match polishing.

Figure 7A:
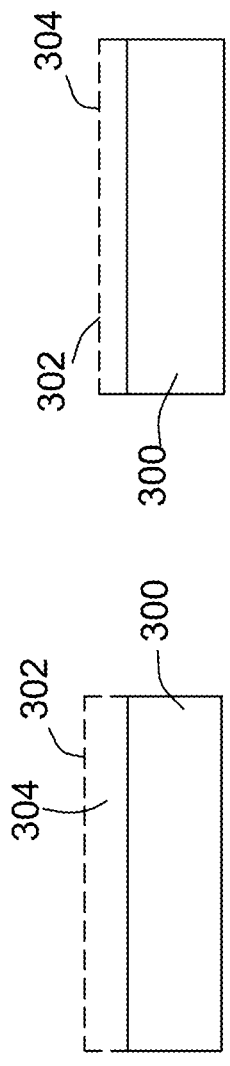
FIGS. 7A-C are a series of cross-sections showing wafer profile shapes before and after polishing according to this disclosure.
Figure 7B:
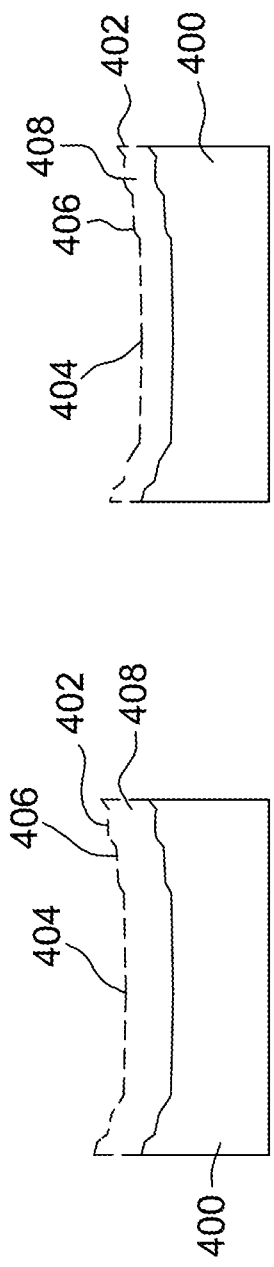
Figure 7C:
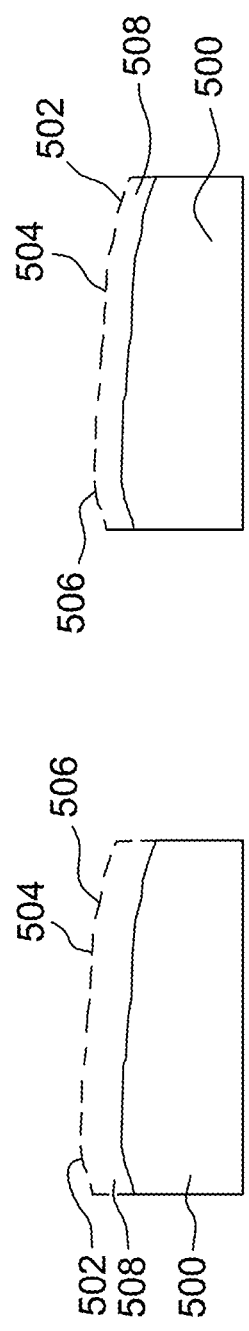

FIGS. 7A-C illustrates some semiconductor wafer shapes before and after shape match polishing. FIG. 7A shows a flat-shaped wafer 300, which is substantially level across a top surface 302. FIG. 7B shows a dish-shaped wafer 400, which has a greater thickness adjacent its periphery 402 and gradually decreases in thickness radially towards its center 404. Thus, a surface 406 of dish-shaped wafer 400 is generally concave. FIG. 7C shows a dome-shaped wafer 500, which is thinner adjacent its periphery 502 and gradually increases in thickness at its center 504. Thus, a surface 506 of dome-shaped wafer 500 is generally convex.

Wafers 300, 400, 500 each include a silicon layer 304, 408, 508, respectively, which covers substantially the entire front surfaces of wafers 300, 400, 500. In some embodiments, silicon layers 304, 408, 508, have a thickness of between about 1 micrometers and about 5 micrometers, as an example. In other embodiments, silicon layers 304, 408, 508 may have any suitable thickness and cover any portions of wafers 300, 400, 500.

While the average thickness of wafers 300, 400, 500 and silicon layers 304, 408, 508, change during shape match polishing, other characteristics such as flatness remain substantially constant. Accordingly, wafers 300, 400, 500 have a post-polishing shape that is substantially similar to their initial shape.

In the example embodiments, silicon layers 304, 408, 508, on wafers 300, 400, 500 are polycrystalline silicon layers, which are primarily used as electron charge traps.

Figure 8:
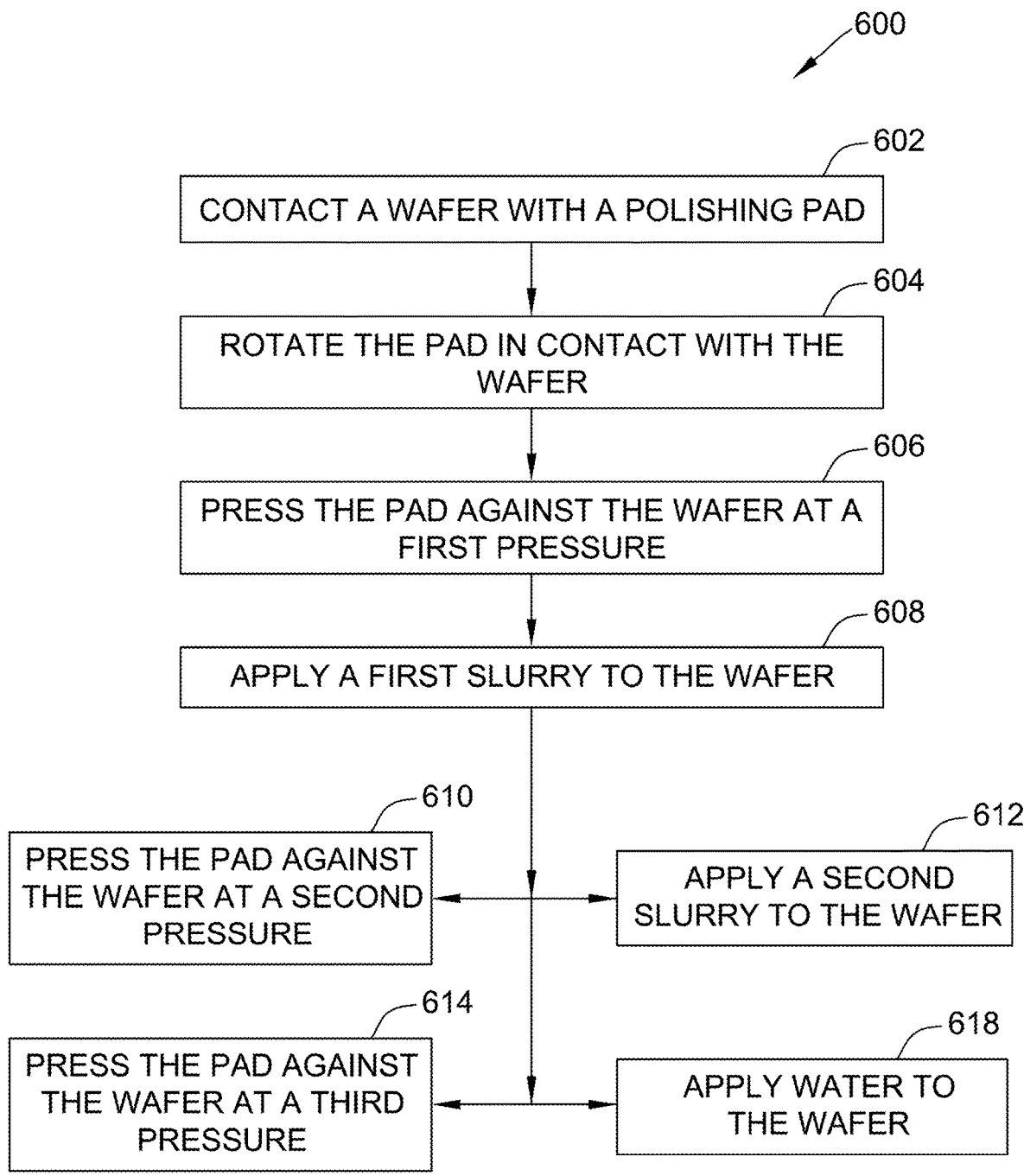
FIG. 8 is a flow diagram showing one embodiment of a method of polishing a semiconductor wafer.

FIG. 8 is a flow chart of an example method 600 of polishing semiconductor wafers. Method 600 generally includes contacting 602 wafer 110 with polishing pad 102, applying 604 a first slurry to wafer 110, rotating 606 polishing pad 102 in contact with wafer 110, and pressing 608 polishing pad 102 against wafer 110 at a first pressure. The method also includes pressing 610 polishing pad 102 against wafer 110 at a second pressure and applying 612 a second slurry to wafer 110 as polishing pad 102 is pressed against wafer 110 at the second pressure. The method further includes pressing 614 polishing pad 102 against wafer 110 at a third pressure and applying 616 water and diluted slurry to wafer 110 as polishing pad 102 is pressed against wafer 110 at the third pressure.

Figure 9:
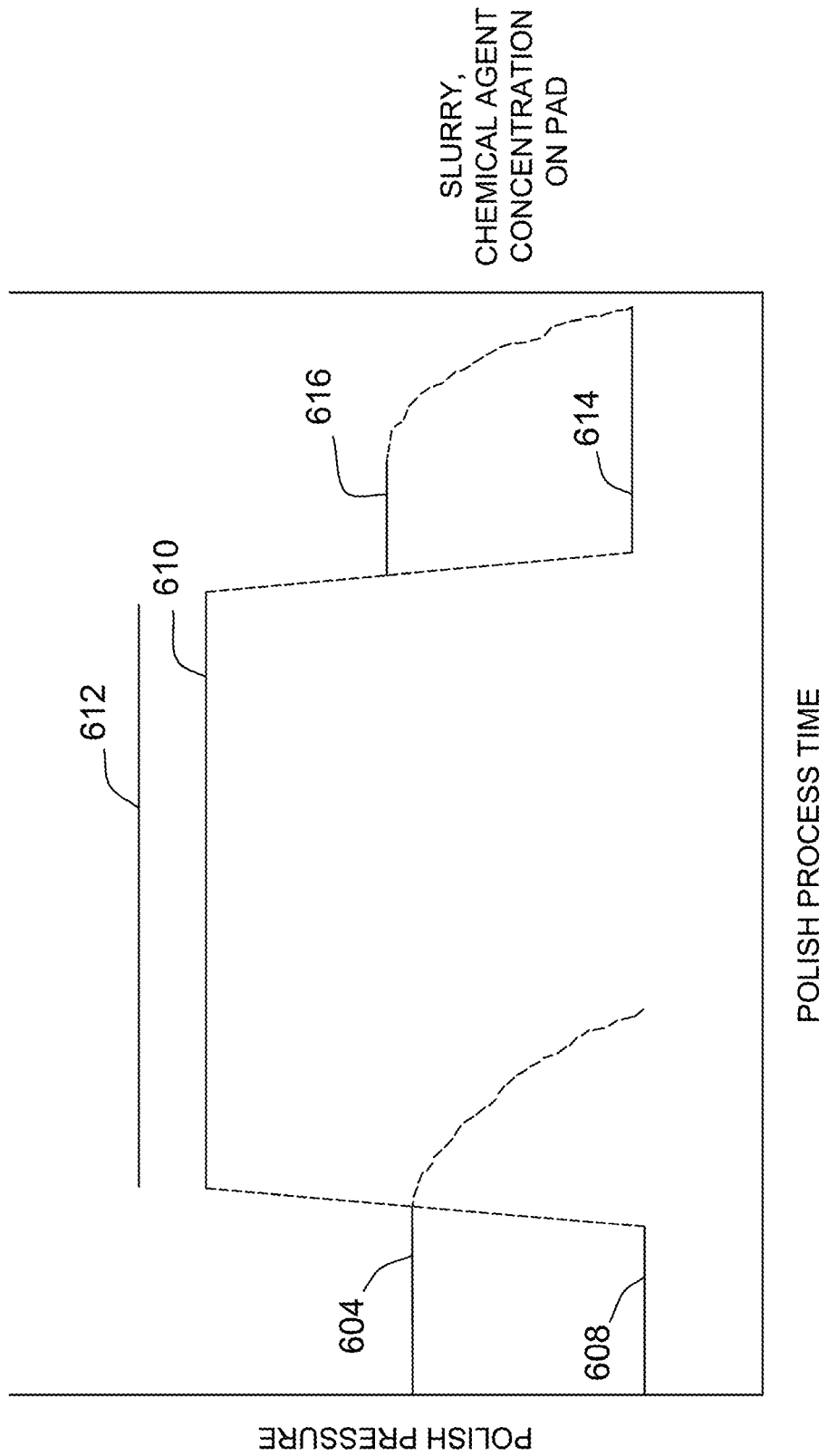
FIG. 9 is a chart of the method shown in FIG. 8 comparing polish process time to pressure of the polishing pad and slurry concentration.

FIG. 9 is a diagram of method 600 showing polish process time compared to pressure of polishing pad 102 and slurry concentration. As shown in FIG. 9, during the initial stage, polishing pad 102 is pressed against wafer 110 at the first pressure between about 0 psi and about 5 psi. In the second stage, polishing pad 102 is pressed against wafer 110 at the second pressure between about 5 psi and about 15 psi. In the third stage, polishing pad 102 is pressed against wafer 110 at the third pressure between about 0 psi and about 5 psi. Specifically, in the illustrated embodiment, the first pressure is approximately 1 psi, the second pressure is approximately 7 psi, and the third pressure is approximately 1 psi. In alternate embodiments, polishing pad 102 may be pressed against wafer 110 at any suitable pressures.

Polishing pad 102 can be pressed against wafer 110 for any suitable amounts of time. In the example embodiment, polishing pad 102 is pressed against wafer 110 at the first pressure for a time period between about 5 and about 20 seconds. Polishing pad 102 is pressed against wafer 110 at the second pressure for a time period between about 100 and about 300 seconds. Polishing pad 102 is pressed against wafer 110 at the third pressure for a time period between about 10 and about 100 seconds.

In the example embodiment of method 600, the first slurry containing abrasive particles is applied between polishing pad 102 and wafer 110 to help polish surface 112 of wafer 110. In some embodiments, the first slurry contains particles having diameters between about 100 nanometers and about 160 nanometers. In some embodiments, the first slurry includes a strong base agent, e.g., without limitation, potassium hydroxide and sodium hydroxide. Conventional slurries such as Nalco DVSTS029 manufactured by Nalco Company of Naperville, Ill., are suitable for use in method 600. When polishing pad 102 is pressed against wafer 110 at the second pressure, the polishing pad works the slurry against surface 112 of wafer 110 to concurrently and uniformly remove material from surface 112 of wafer 110 and help improve the overall smoothness of wafer 110. As surface 112 of wafer 110 is polished, silicon is removed and some minor damage is created on surface 112 by the abrasive action of the slurry. As an example, the intermediate polishing operation preferably removes less than about 1 micrometer of material from surface 112 of wafer 110. The minor damage created by the polishing slurry on surface 112 is subsequently removed in final polishing.

In the method 600, the second slurry containing abrasive particles is applied between polishing pad 102 and wafer 110 to help further polish surface 112 of wafer 110. In some embodiments, the second slurry contains particles having diameters between about 10 nanometers and about 100 nanometers. More preferably, the particles have diameters between about 20 nanometers and about 80 nanometers. Most preferably, the particles have diameters between about 40 nanometers and about 60 nanometers. In one embodiment, the second slurry applied to the second wafer includes a weak base agent, e.g., without limitation, ammonium hydroxide, tetramethylammonium hydroxide, and amine. An ammonia stabilized colloidal silica slurry is Glanzox 3900, which is commercially available from Fujimi Incorporated of Aichi Pref. 452, Japan. Glanzox 3900 has silica content of from about 8 to about 10% and a particle size of from about 0.025 to about 0.035 micrometers.

In method 600, the pad is pressed against wafer 110 at the third pressure and water is applied to wafer 110 to provide a final "touch" or "flash" polishing operation to improve sub-micrometer roughness and substantially eliminate minor defects remaining on the surface 112 of wafer 110. The final polishing also maintains the wafer flatness while imparting a smooth, specular finish to surface 112 of wafer 110 typical for polished wafers and desired by many device manufactures. This type of final polish generally removes less than about 1 micrometer of material, preferably between about 0.25 micrometers and about 0.5 micrometers of material from surface 112 of wafer 110. The water dilutes the slurry as the water is added. In some embodiments, the slurry is diluted to about one part silica slurry to about 10 parts deionized water.

Embodiments of the methods and systems described may more efficiently produce semiconductor wafers having improved surface characteristics compared to prior methods and systems. For example, the systems and methods described provide an improved polishing system which reduces waste and increases efficiency during wafer polishing. More specifically, the embodiments described provide for polishing a wafer such that an initial wafer profile matches a post-polishing waver profile. The embodiments reduce the material removed during polishing and maintain uniform thickness of layers in the polished wafer.

Additionally, in some embodiments the polishing pad is selectively dressed in its center and edge areas. As such, the impacts from variations on the polishing pad as the polishing pad wears and acquires build-up are reduced. Also, selectively dressing the edge area or center area of the polishing pad facilitates polishing a semiconductor wafer to a consistent wafer profile shape.

Further, the method can reduce the poly grain boundary as compared to a conventional method. For example, when viewed under an atomic force microscope at 2×2 micron view, the poly grain boundary is less pronounced. Less grain boundary has a number of benefits, including better surface roughness, less re-generated roughness in downstream processes and improved metrology.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A method of processing a semiconductor wafer comprising:
    depositing a silicon layer on the semiconductor wafer, the silicon layer having a substantially uniform thickness;
    inspecting the semiconductor wafer to determine an initial wafer profile prior to polishing the silicon layer, the initial wafer profile having a shape;
    dressing a polishing pad based on the shape of the initial wafer profile including dressing at least one of a center area and an edge area of a pad surface of the polishing pad based on the initial wafer profile of the semiconductor wafer, wherein the center area of the pad surface is dressed if the initial wafer profile of the semiconductor wafer is classified as dome-shaped and the edge area of the pad surface is dressed if the initial wafer profile of the semiconductor wafer is classified as dish-shaped; and
    polishing the silicon layer using the polishing pad to smooth the silicon layer such that the thickness is substantially uniform after polishing and such that the semiconductor wafer has a polished shape that matches the shape of the initial wafer profile.

2. The method of claim 1 wherein the silicon layer is a polycrystalline silicon layer, the layer having a reduced roughness after polishing and the polycrystalline grain boundary being reduced by polishing.

3. The method of claim 1 wherein the edge area is dressed, the pad surface having a circular shape and the edge area extending radially between about 2.5 cm and about 5 cm from an outer edge of the polishing pad.

4. The method of claim 1 wherein the center area is dressed, the pad surface having a circular shape and the center area being spaced radially inward from an outer edge of the polishing pad between about 15 cm and about 20 cm.

5. The method of claim 1 further comprising applying slurry to an outer surface of the silicon layer, the slurry including abrasive particles and a base.

6. The method of claim 1 further comprising positioning the semiconductor wafer in a polishing apparatus, the polishing apparatus including the polishing pad.

7. The method of claim 1 further comprising inspecting the semiconductor wafer to determine a post-polishing wafer profile after removal of a portion of the silicon layer.

8. The method of claim 7 further comprising comparing the initial wafer profile to the post-polishing wafer profile to determine variations between the profiles.

9. The method of claim 8 further comprising dressing one of the center area and the edge area of the pad surface of the polishing pad based on the variations between the initial wafer and the post-polishing wafer profiles.

10. A method of processing a semiconductor wafer comprising:
depositing a silicon layer on the semiconductor wafer, the silicon layer including an inner surface facing the semiconductor wafer and an outer surface opposite the inner surface, the silicon layer having a first thickness defined between the inner surface and the outer surface, the first thickness being substantially uniform throughout the silicon layer;
inspecting the semiconductor wafer to determine an initial wafer profile prior to contacting the outer surface of the silicon layer with a pad surface;
classifying a shape of the initial wafer profile;
positioning the semiconductor wafer in a polishing apparatus, the polishing apparatus including a polishing pad having a pad surface, the pad surface defining a center area and an edge area;
dressing the center area of the pad surface if the initial wafer profile of the semiconductor wafer is classified as dome-shaped and the edge area of the pad surface if the initial wafer profile of the semiconductor wafer is classified as dish-shaped;
contacting the outer surface of the silicon layer with the pad surface;
applying slurry to the outer surface of the silicon layer; and
rotating the polishing pad while the pad surface is in contact with the outer surface of the silicon layer such that a portion of the silicon layer is removed to provide a smooth surface of the silicon layer, a second thickness being defined between the inner surface and the smooth surface, the second thickness being substantially uniform throughout the silicon layer.

11. The method of claim 10 wherein one of the center area and the edge area is dressed based on the initial wafer profile such that the dressed pad surface polishes the semiconductor wafer to have a polished shape that matches the shape of the initial wafer profile.

12. The method of claim 10 further comprising inspecting the semiconductor wafer to determine a post-polishing wafer profile after removal of a portion of the silicon layer.

13. The method of claim 12 further comprising comparing the initial wafer profile to the post-polishing wafer profile to determine variations between the profiles.

14. The method of claim 13 further comprising dressing one of the center area and the edge area of the pad surface based on the variations between the initial wafer and the post-polishing wafer profiles.

15. The method of claim 10 wherein the edge area is dressed, the pad surface having a circular shape and the edge area extending radially between about 2.5 cm and about 5 cm from an outer edge of the polishing pad.

16. The method of claim 10 wherein the center area is dressed, the pad surface having a circular shape and the center area being spaced radially inward from an outer edge of the polishing pad between about 15 cm and about 20 cm.

* * * * *